United States Patent [19]
Goetsch et al.

[11] Patent Number: 6,098,283
[45] Date of Patent: Aug. 8, 2000

[54] METHOD FOR FILLING VIAS IN ORGANIC, MULTI-LAYER PACKAGES

[75] Inventors: Mike Goetsch, Phoenix; Jim Siettmann, Gilbert; Leo Craft; Eric Swanger, both of Chandler, all of Ariz.

[73] Assignee: Intel Corporation, Santa Clara, Calif.

[21] Appl. No.: 09/078,448

[22] Filed: May 13, 1998

Related U.S. Application Data

[62] Division of application No. 08/769,552, Dec. 19, 1996, abandoned.

[51] Int. Cl.[7] ...................................................... H05K 3/40
[52] U.S. Cl. ............................... 29/852; 29/830; 29/846; 174/263; 174/264; 257/738; 216/18
[58] Field of Search .................................. 174/260, 261, 174/262, 263, 264, 265; 228/180.21, 180.22; 257/679, 738, 778, 780; 361/760, 761–764, 772, 783, 774, 779; 438/108, 612, 613; 439/68, 83; 29/830, 839, 840, 846, 852; 216/18; 427/97

[56] References Cited

U.S. PATENT DOCUMENTS

| | | | |
|---|---|---|---|
| 4,830,264 | 5/1989 | Bitaillou et al. . | |
| 5,275,330 | 1/1994 | Isaacs et al. | 228/180.22 |
| 5,334,857 | 8/1994 | Mennitt et al. | 257/786 |
| 5,379,191 | 1/1995 | Carey et al. . | |
| 5,438,216 | 8/1995 | Juskey et al. . | |
| 5,508,556 | 4/1996 | Lin | 257/691 |
| 5,512,786 | 4/1996 | Imamura et al. . | |
| 5,563,446 | 10/1996 | Chia et al. . | |
| 5,592,025 | 1/1997 | Clark et al. . | |
| 5,598,036 | 1/1997 | Ho . | |
| 5,633,533 | 5/1997 | Andros et al. | 361/719 |
| 5,637,920 | 6/1997 | Loo . | |
| 5,699,613 | 12/1997 | Chong et al. | 29/852 |

FOREIGN PATENT DOCUMENTS

| | | |
|---|---|---|
| 61-174752 | 8/1986 | Japan . |
| 1-98252 | 4/1989 | Japan . |

*Primary Examiner*—Leo P. Picard
*Assistant Examiner*—John B. Vigushin
*Attorney, Agent, or Firm*—Blakely, Sokoloff, Taylor & Zafman LLP

[57] ABSTRACT

A via for an electronic assembly. The assembly includes a substrate which has a via hole. The via hole is filled with a conductive material that extends across a diameter of the hole. The via hole can be filled by reflowing a solder ball that is attached to an outer surface of the substrate. The substrate may be part of a multi-layered integrated circuit package, wherein the vias couples internal routing layers with external contacts of the package. The filled vias can withstand extended thermal life cycles of the package.

9 Claims, 1 Drawing Sheet

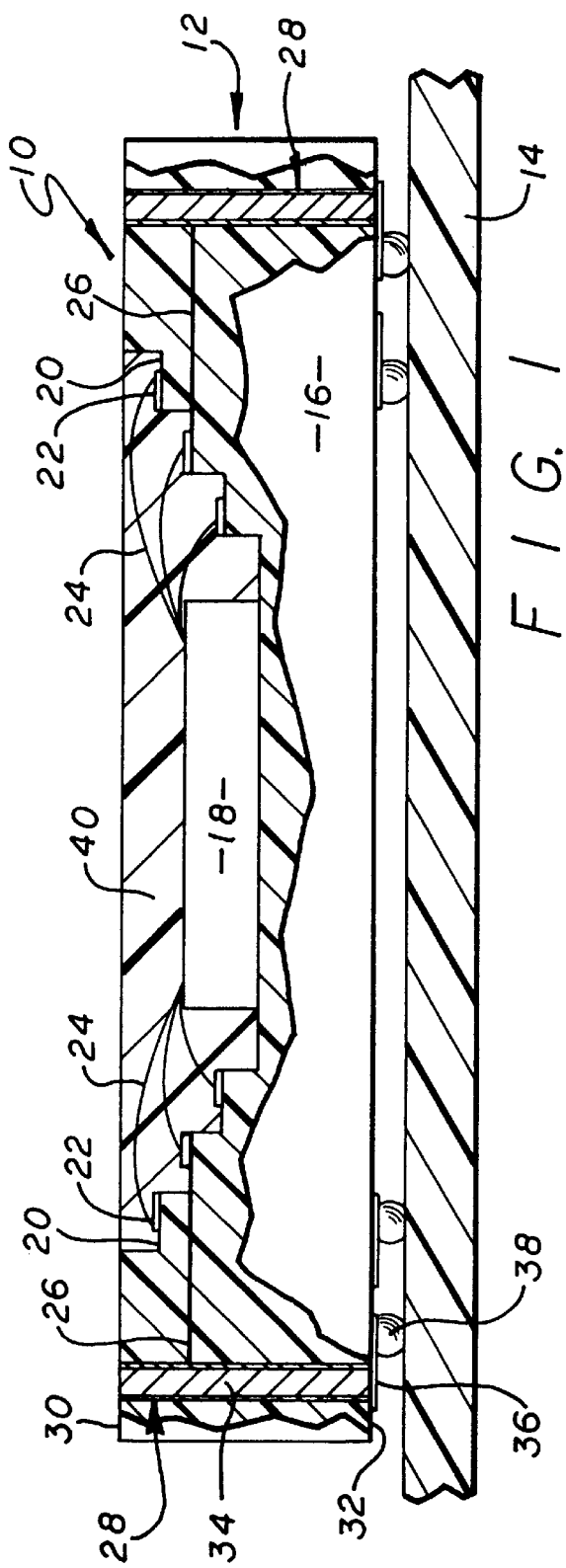
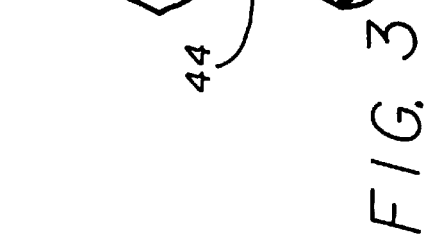
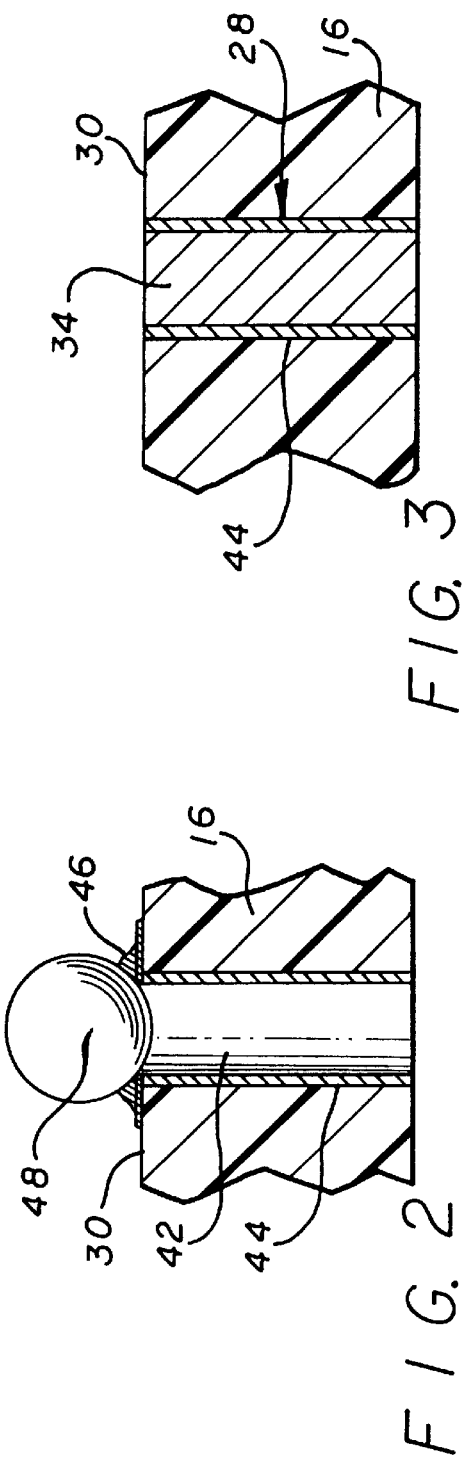

METHOD FOR FILLING VIAS IN ORGANIC, MULTI-LAYER PACKAGES

This application is a divisional application of U.S. application No. 08/769,552, filed Dec. 19, 1996, now abandoned.

BACKGROUND OF THE INVENTION

1. Field of the Invention

The present invention relates to an electronic assembly that contains filled via holes.

2. Description of Related Art

Integrated circuits are typically enclosed by a package that is soldered to a printed circuit board. The packages may include a substrate that supports the integrated circuit, and plurality of external contacts which couple the substrate to the printed circuit board. The contacts may be solder balls that are attached to the substrate and subsequently reflowed to attach the package to the circuit board.

The substrate typically contains internal routing and conductive vias which provide an electrical path between substrate layers and electrically couple the integrated circuit to the external contacts. Vias are constructed by initially forming holes in the substrate and then plating the inner surface of the holes with a conductive metal material. The plated material provides a conductive path through the substrate. The plating process does not fill, nor is intended to fill, the holes within the substrate. Consequently, each via has a hole extending therethrough.

Highly functional integrated circuits such as microprocessors require packages that have a large number an internal routing traces. The internal routing traces may be formed in multiple layers of the substrate. The multiple layers are coupled together by vias.

Any change in temperature will induce a thermal expansion or contraction of the package, integrated circuit and printed circuit board. The thermal expansion/contraction creates stresses in the vias. It has been found that plated through vias which extend through the length of a multi-layer package will fail when thermally cycled. It would therefore be desirable to provide a more robust via than what is found in the prior art.

SUMMARY OF THE INVENTION

The present invention is a via for an electronic assembly. The assembly includes a substrate which has a via hole. The via hole is filled with a conductive material that extends across a diameter of the hole. The via hole can be filled by reflowing a solder ball that is attached to an outer surface of the substrate. The substrate may be part of a multi-layered integrated circuit package, wherein the vias couples internal routing layers with external contacts of the package. The filled vias can withstand extended thermal life cycles of the package.

BRIEF DESCRIPTION OF THE DRAWINGS

FIG. 1 is a cross-sectional view of an electronic assembly of the present invention;

FIG. 2 is a cross-sectional view showing a solder ball held in place by tacky flux on a via hole;

FIG. 3 is a cross-sectional view showing the solder ball reflowed to fill the via hole.

DETAILED DESCRIPTION OF THE INVENTION

Referring to the drawings more particularly by reference numbers, FIG. 1 shows an electronic assembly 10 of the present invention. The assembly 10 may include a package 12 that is attached to a printed circuit board 14. The package 12 includes a substrate 16 that supports an integrated circuit 18. By way of example, the integrated circuit 18 may be a microprocessor, although it is to be understood that other electrical devices may be supported by the substrate 16.

The substrate 16 may have a plurality of bond shelves 20. The bond shelves 20 contain a plurality of bond pads 22. The integrated circuit 18 is coupled to the bond pads 22 of the bond shelves 20 by a plurality of bond wires 24. The bond pads 22 are connected to internal routing traces and internal power/ground busses 26 within the substrate 16. The internal traces and busses 26 are electrically connected to vias 28 which extend from a first surface 30 of the substrate 16 to a second surface 32 of the substrate 16.

The vias 28 are filled with a conductive material 34 that extends across the length and diameter of the vias 28. In the preferred embodiment, the vias 28 are completely filled with conductive material. The filled vias 28 have more strength and rigidity than conventional vias which have plated walls and a residual hole extending through the vias. It has been found that the filled vias of the present invention have a longer thermal life cycle than conventional plated vias of the prior art.

The vias 28 are coupled to external lands 36 located on the second surface 32 of the substrate 16. The lands 36 are attached to the printed circuit board 14 by solder balls 38. Additionally, the integrated circuit 18 is typically enclosed by an encapsulant 40.

FIGS. 2 and 3 show a process for filling the vias 28. The substrate 16 is typically provided with via holes 42 formed therein. The via holes 42 may be plated with a copper material (followed by Ni then Au) 44 using conventional plating processes. A solder flux 46 is initially applied to the via holes 42 on the first surface 30 of the substrate 16. The solder flux 46 may be applied by screening a tacky solder flux to the via holes 42.

Solder balls 48 are then placed onto the via holes 42. The solder balls 48 may be applied with a gravity fed fixture (not shown) that is typically used to apply solder balls to the lands of a ball grid array (BGA) package. The substrate 16 and solder balls 48 are then placed in a oven to heat and reflow the solder. The force of gravity pulls the reflowed solder into the via holes 42 to fill the same. In the preferred embodiment, each solder ball 48 fills a via hole 42 without extending beyond the surface 30 of the substrate 16. By way of example, it has been found that a solder ball 48 having a diameter of 0.025 inches will adequately fill a via that has a hole diameter of 0.012 inches and a length of 0.08 inches.

After the vias 28 are filled, contact solder balls 38 are typically attached to the lands 36 of the substrate 16. The contact solder balls 38 preferably have a lower melting temperature than the balls 48 which fill the vias 28. The higher melting temperature insures that the conductive material 34 within the vias does not melt and flow out of the package 12, when the solder balls 38 are reflowed to attach the package 12 to the printed circuit board 14. By way of example, the solder balls 46 that fill the vias 28 can have a composition of 90% tin and 10% lead. The solder balls 38 which couple the package 12 to the circuit board 14 typically have a composition of 63% tin and 37% lead.

The integrated circuit 18 is eventually mounted to the substrate 16, bonded to the bond shelves 20 and enclosed by the encapsulant 40. The sealed package 12 is attached to the circuit board 14 by the solder balls 38. Although a process for filling the vias 28 by reflowing solder balls 48 is shown and described, it is to be understood that the vias 28 may be filled by other techniques. By way of example, a solder paste may be screened or dispensed into the via 42 holes and then subsequently reflowed to create filled vias 28.

What is claimed is:

1. A method for creating a via comprising:

providing a substrate including a via hole having a diameter;

filling said via hole with a conductive material from a reflowed solder ball so that said conductive material extends across said diameter of said via hole; and attaching an external electrical contact solder ball to said substrate.

2. The method as recited in claim 1, wherein prior to filling said via hole, the method further comprises:

placing a solder ball onto said via hole.

3. The method as recited in claim 2, further comprising reflowing the solder ball to produce the reflowed solder.

4. The method as recited in claim 3, wherein said solder ball that fills said via hole with a conductive material upon reflow has a higher melting temperature than said external electrical contact solder ball attached to said substrate.

5. A method for creating a via in an electronic package, comprising:

providing a substrate which has a via hole;

placing a solder ball onto said via hole;

reflowing said solder ball so that said via hole is filled with said reflowed solder, and, attaching an external electrical contact solder ball to said substrate.

6. The method as recited in claim 5, further comprising placing a solder flux onto said via hole before placing said solder ball onto said via hole.

7. The method as recited in claim 5, wherein said via hole has a diameter of approximately 0.012 inches and a length of approximately 0.08 inches, and said solder ball has a diameter of approximately 0.025 inches.

8. The method as recited in claim 5, wherein said solder ball that fills said via hole has a higher melting temperature than said external electrical contact solder ball attached to said substrate.

9. A method for creating a via in an electronic assembly, comprising:

providing a substrate which has a via hole, wherein said via hole has a diameter;

filling said via hole with a conductive material from a reflowed solder ball so that said conductive material extends across said diameter of said via hole; and, attaching an external electrical contact solder ball to said substrate, the external electrical contact solder ball having a lower melting temperature than said solder ball.

* * * * *